United States Patent [19]

Figueredo

[11] Patent Number: 4,576,322

[45] Date of Patent: Mar. 18, 1986

[54] MACHINE FOR ULTRASONICALLY BONDING WIRES TO CAVITY-DOWN INTEGRATED CIRCUIT PACKAGES

[75] Inventor: Jorge H. Figueredo, Chula Vista, Calif.

[73] Assignee: Burroughs Corporation, Detroit, Mich.

[21] Appl. No.: 650,445

[22] Filed: Sep. 14, 1984

[51] Int. Cl.[4] .............................................. B23K 37/00
[52] U.S. Cl. ..................................................... 228/4.5
[58] Field of Search ........................... 228/4.5, 1.1, 179

[56] References Cited

U.S. PATENT DOCUMENTS

| | | | |
|---|---|---|---|
| 3,328,875 | 7/1967 | Pennings | 228/44.7 X |
| 3,648,354 | 3/1972 | Mashino et al. | 228/4.5 X |
| 3,787,966 | 1/1974 | Klossika | 228/4.5 X |
| 4,527,730 | 7/1985 | Shirai et al. | 228/4.5 X |

Primary Examiner—Nicholas P. Godici
Assistant Examiner—Carmine Cuda
Attorney, Agent, or Firm—Charles J. Fassbender; Kevin R. Peterson

[57] ABSTRACT

A machine for bonding a wire between pads on an integrated circuit die and a cavity-down circuit package includes a wedge for transferring heat energy to one part of the wire of sufficient magnitude to bond it to the pads, a clamp for grasping and pulling on another part of the wire to break it after the bonding operation, and a positioning mechanism for moving the wedge and clamp to selectable bonding locations over the die and package; wherein both the wedge and clamp include respective passageways through which the wire is threaded and slides; the clamp moves the portion of the wire between the passageways to a first position where it makes a large angle with the wedge, and to a second position where it makes a substantially smaller angle with the wedge; and the wedge is adapted to pass the wire without bending it at both the large and small angles.

11 Claims, 10 Drawing Figures

MACHINE FOR ULTRASONICALLY BONDING WIRES TO CAVITY-DOWN INTEGRATED CIRCUIT PACKAGES

BACKGROUND OF THE INVENTION

This invention relates to ultrasonic wire bonding machines; and more particularly, it relates to such machines that are suitable for bonding wires to cavity-down integrated circuit packages.

Traditionally, integrated circuit dies have been packaged in cavity-up packages. A cross section of a typical cavity-up package is shown in FIG. 1A. There the package is indicated by reference numeral 1; and the die is indicated by reference numeral 2. Input/output leads 3 extend from a surface of package 1 that is opposite the cavity in which die 2 is disposed. Electrical signals on the leads 3 are transferred to the die 2 by bonding wires 4.

It is conventional to bond each of the wires 4 between a metal pad on die 2 and a metal pad on package 1 by an automatic ultrasonic bonding machine. Such machines are manufactured, for example, by K & S Corporation of Horsham, Pa. and Mech-El Corporation of Woburn, Mass. They include an elongated wedge 5 and a transducer 6 which together hold a bonding wire 7 and bond the wire to the metal pads.

During the bonding operation, wire 7 is first bonded to the metal pad on die 2. This is achieved by holding the wire 7 between the metal pad and wedge 5 as illustrated in FIG. 1A; and simultaneously vibrating the wedge by means of transducer 6 at ultrasonic frequencies to heat the wire at the wedge. Thereafter, wire 7 slides through wedge 5 and transducer 6 as the wedge 5 is aligned with the metal pad on package 1. Then, a second bond is made between wire 7 and the metal pad on package 1. Subsequenty, the wire 7 is broken by a clamp 8 which closes on the wire and pulls the wire along its axis. Then the entire bonding operation is repeated.

Throughout the above described bonding operation, the angle which wire 7 makes with wedge 5 is fixed. That angle is determined by the position of a cylindrically-shaped hole 5A in the tip of wedge 5 and another hole 6A in transducer 6 through which the wire 7 slides. Typically, hole 6A is located such that wire 7 makes an angle of 60° with wedge 5. Such a large angle is desirable because it insures that wire 7 bends beneath wedge 5 when it makes contact with the metal pad on the die 2. As that angle decreases, wire 7 tends to push out of hole 5A rather than bend under the wedge, which results in a weak bond.

A problem, however, with the cavity-up package 1 is that it is severely limited in its heat-dissipating capability. This is because the leads 3 extend from the surface of the package which lies over the printed circuit board into which the package is to be mounted. Thus, a heat sink cannot be attached to package 1 to cool it.

To overcome this problem, the cavity-down package 1' of FIG. 1B has recently been developed. In it, the leads 3' extend from the surface of the package that has the cavity in which die 2' is disposed. This enables a heat sink 9 to be attached to the opposite surface of the package. Thus, the cavity-down package is suitable for the most modern die 2' which are larger, contain more circuitry, have more input/output leads, and dissipate more power than the traditional die 2.

However, a problem with the cavity-down package is that conventional ultrasonic wire bonding machines cannot be used to bond the wires 7 between the pads on chip 2' and the pads on package 1'. This is because, as FIG. 1B shows, the leads 3' on package 1' interfere with the bonding wire 7 when it is held by the wedge 5 and the transducer 6. Also, the leads 3' interfere with the clamp 8. Either interference will cause wire 7 to break and is simply unworkable.

Accordingly, a primary object of the invention is to provide an improved machine for bonding wires between an integrated circuit die and an integrated circuit package.

Another object of the invention is to provide a mechanism for bonding wires between the pads of an integrated circuit die and the pads of a cavity-down integrated circuit package.

BRIEF SUMMARY OF THE INVENTION

The above objects, and others, are achieved in accordance with the invention by a wire bonding machine that includes a wedge for transferring heat energy to a part of the wire of sufficient magnitude to bond it to a metal pad, a clamp for grasping and pulling on another part of the wire to break it after the bond is made, and a positioning mechanism for moving the wedge and clamp to selectable bonding pads over a die and package; wherein:

both the wedge and the clamp include respective passageways through which the wire is threaded and slides;

the clamp is pivotally held by the positioning mechanism and pivots the portion of the wire between the passageways to first and second angular positions relative to the wedge;

the portion of the wire between the passageways forms an angle of at least 50° with the wedge in the first position and forms an angle of not more than 35° with the wedge in the second position; and the passageway through the wedge is tapered to permit the wire from the clamp to pass through it, without bending, at both of the angular positions.

BRIEF DESCRIPTION OF THE DRAWINGS

Various features and advantages of the invention are described herein in conjunction with the accompanying drawings wherein.

DETAILED DESCRIPTION OF THE INVENTION

Figure 1A:
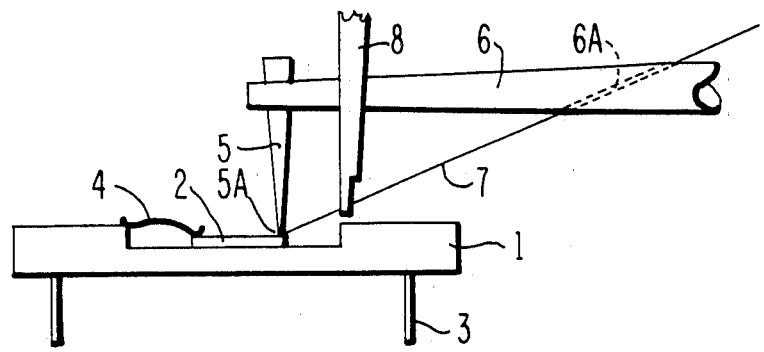
FIG. 1A illustrates the prior art bonding of a wire between an integrated circuit die and a cavity-up integrated circuit package.
Figure 1B:
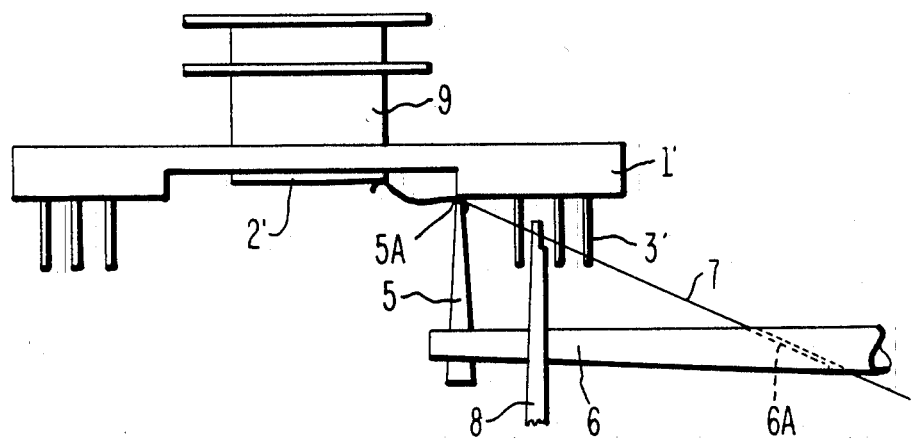
FIG. 1B illustrates the problem of attempting to utilize the prior art mechanism of FIG. 1A to bond a wire between an integrated circuit die and a cavity-down integrated circuit package.
Figure 2:
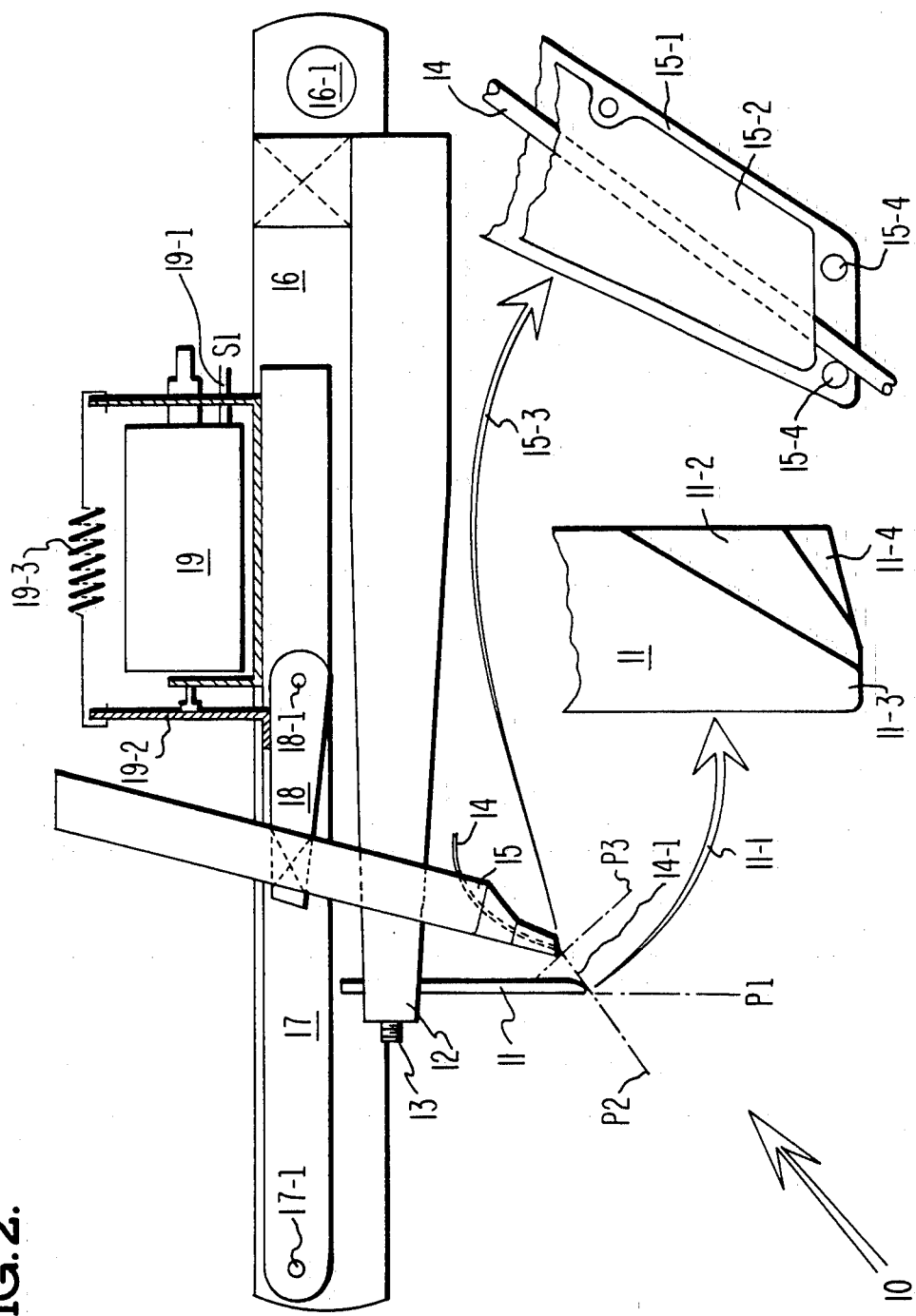
FIG. 2 illustrates a preferred embodiment of the invention which is suitable for bonding a wire from an integrated circuit die to a cavity-down integrated circuit package.

Referring now to FIG. 2, the details of a bonding machine mechanism 10 that is constructed according to the invention will be described in detail. This mechanism includes a wedge 11 which is coupled to a transducer 12 by a screw 13. Wedge 11 has an elongated shape; and it has an end 11-1 that has a hole 11-2, a horizontal surface 11-3, and an inclined surface 11-4.

In the preferred embodiment, one side of hole 11-2 makes an angle of 50°-60° with the axis of wedge 11; while the other side of hole 11-2 makes an angle of 10°-35° with that axis. A bonding wire 14 passes through hole 11-2; and due to the tapered shape of the hole, the wire can pass through it at various angles without bending.

Also included in the FIG. 2 mechanism is a clamp 15. It is comprised of two similarly shaped members 15-1 and 15-2 that are spaced one behind the other. Transducer 12 fits between these two members. At one end 15-3 of the clamp, members 15-1 and 15-2 have a pair of planar surfaces that move together to grasp the wire 14. Also at end 15-3, a pair of rods 15-4 extend from member 15-1 to member 15-2 to form a passageway through which wire 14 fits.

Reference numeral 14-1 indicates that portion of wire 14 that passes from end 15-3 of the clamp to end 11-1 of the wedge. Wire portion 14-1 is positioned by three arms 16, 17, and 18. Arm 16 pivots on an axle 16-1; arm 17 pivots on another axle 17-1; and arm 18 pivots on still another axle 18-1. Transducer 12 couples to arm 16 and moves in synchronization with it.

When arm 16 is pivoted on axle 16-1, end 11-1 of the wedge moves along a path P1 that is parallel to the axis of the wedge. By comparison, when arm 17 is pivoted on axle 17-1, end 15-3 of the clamps moves along a path P2 that is essentially parallel to the steeper side of the hole 11-2. And, when arm 18 is pivoted on axle 18-1, end 15-3 of the clamps moves along a path P3 that is essentially perpendicular to path P2.

Movement of arm 18 occurs in response to an electrical signal S1 that is sent to a solenoid 19. When signal S1 is present on the solenoid's terminals 19-1, an armature 19-2 is pushed from the solenoid and it pivots arm 18 in a counterclockwise direction. Conversely, when signal S1 is not present, a spring 19-3 pushes armature 19-2 back and moves arm 18 in a clockwise direction. Additional solenoids and armatures (not shown) are also provided to move arms 17 and 18.

Turning now to FIGS. 3A-3F, the manner in which the above mechanism 10 operates to bond wire 14 between a pad on a chip 20 and a pad on an integrated circuit package 21 will be described. In these figures, arms 16, 17, and 18 are represented by straight lines; and the axles 16-1, 17-1, and 18-1 on which they respectively pivot are represented by dots.

Figure 3A:
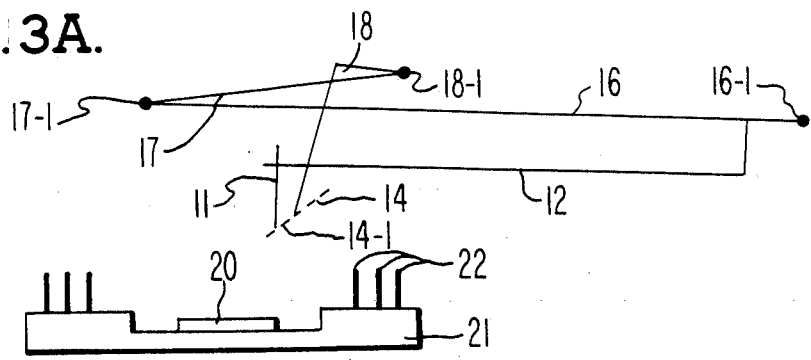
FIGS. 3A-3G illustrate the sequence by which the FIG. 2 mechanism operates during a bonding operation.

Initially, as is illustrated in FIG. 3A, arm 16-1 is in an upward position, while arms 17 and 18 are both in a downward position. In this initial position, it is critical that wire section 14-1 makes an angle of 50°-60° with the axis of wedge 14. Also, in the initial position, the members 15-1 and 15-2 of the clamp are closed against wire 14.

Figure 3B:
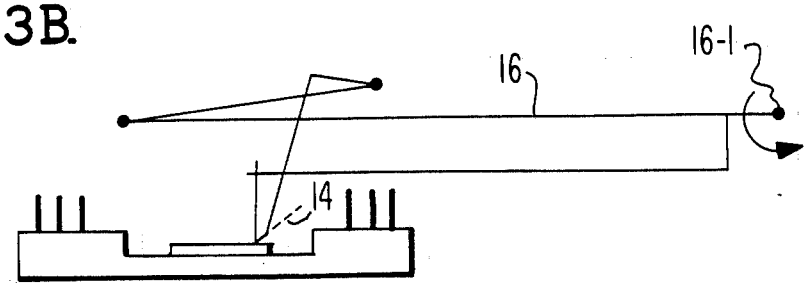

Subsequently, as is shown in FIG. 3B, arm 16 is pivoted downward on axle 16-1 while the angles between arms 16 and 17 and 17 and 18 remain unchanged. Due to this movement, the tip of wire section 14-1 that protrudes through end 11-1 of the wedge engages a pad on chip 20 and bends under surface 11-3 of the wedge. While wire 14 is so held between surface 11-3 and the pad, transducer 12 and wedge 11 are vibrated at ultrasonic frequencies; and this in turn creates friction which heats and bonds the wire under surface 11-3 to the pad.

For this bond to occur properly, it is critical that wire section 14-1 makes an angle of 50° to 60° with the wedge when it engages the pad on chip 20. If wire section 14-1 makes an angle of less than 50° with the wedge, then it is pushed back into the wedge prior to bending under the wedge when it contacts the bonding pad. If wire section 14-1 is pushed back so far that it is not completely underlying all of the wedge surface 11-3, then the bond to the pad will be too weak and will easily break when pulled.

Conversely, if the angle which wire section 14-1 makes with wedge 11 exceeds 60°, then the incline of wedge surface 11-4 is forced to be too small to insure that the inclined surface does not touch (and break) the integrated circuit die. Alternatively, if the incline of surface 11-4 is not reduced, then the amount of material between surface 11-4 and the tapered hole 11-2 will be too small to insure that it does not break.

Figure 3C:
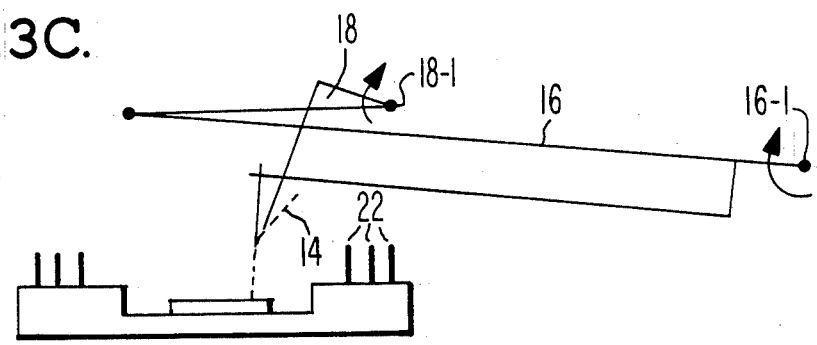

After the bond to the pad on the integrated circuit chip is made, members 15-1 and 15-2 of the clamp move apart to allow the wire 14 to slide between them. Then, as illustrated in FIG. 3C, arm 16 pivots upward on axle 16-1. Also, arm 18 pivots upward on axle 18-1 to decrease the angle that wire section 14-1 makes with wedge 11 to 10°-35°.

Figure 3D:
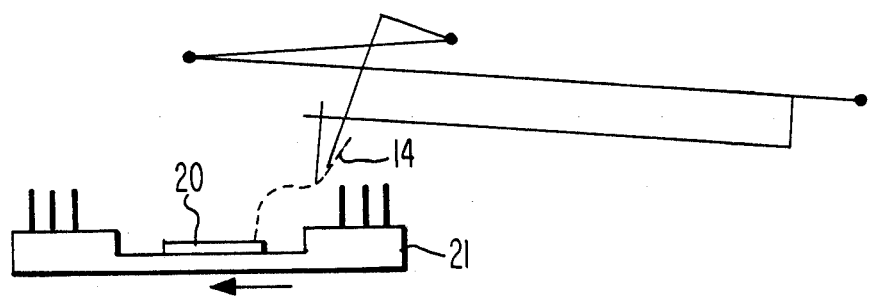
Figure 3E:
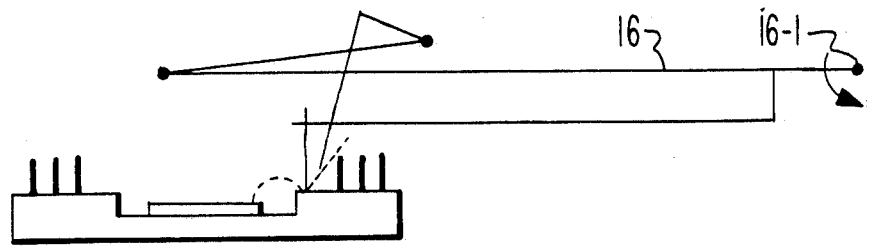

Thereafter, as illustrated in FIG. 3D, integrated circuit package 21 is moved on a table (not shown) in order to align end 11-1 of the wedge with a bonding pad on the package. When this alignment is complete, members 15-1 and 15-2 of the clamp close on wire 14; and then arm 16 pivots downward on axle 16-1 as illustrated in FIG. 3E. This downward movement stops when the portion of wire 14 under wedge surface 11-3 makes contact with the bonding pad on the package.

Figure 3F:
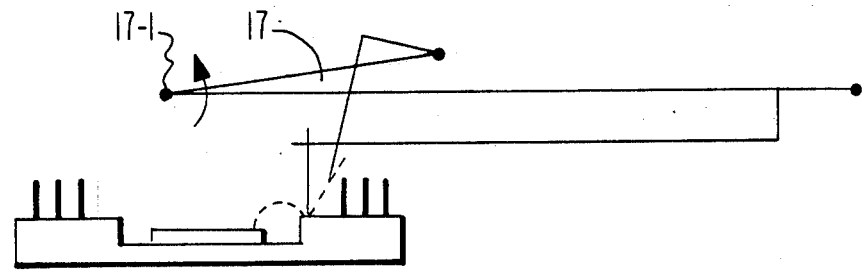
Figure 3G:
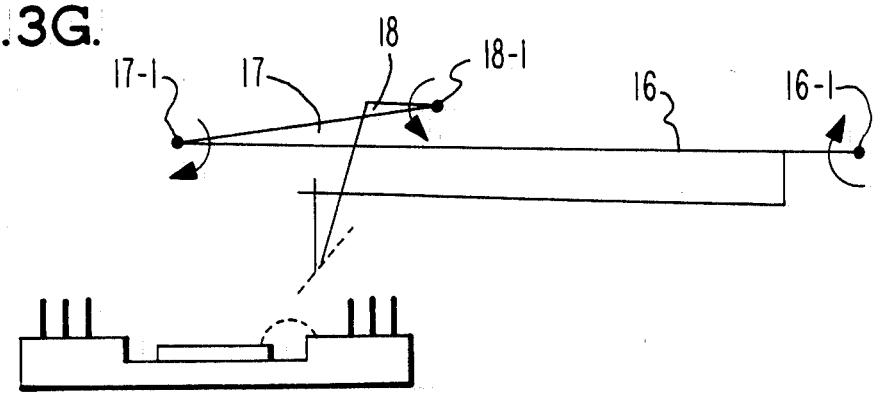

During this movement of FIGS. 3D and 3F, it is critical that the wire section 14-1 does not hit the package leads 22. With the disclosed mechanism, this is achieved by placing arm 18 in an upward position in FIG. 3C such that wire section 14-1 makes an angle of only 15°-35° with wedge 11.

In one cavity-up package, the leads 22 are 0.180 inches from the bonding pads on the package; and the leads are 0.180 inches in height. Thus an angle of 45° is formed by a line from the package pads to the tip of the package leads. And since wire section 14-1 makes an angle of only 10°-35° with wedge 11, the leads will not interfere with its movement.

After wedge 15 reaches the position shown in FIG. 3E, transducer 12 and the wedge are vibrated at ultrasonic frequencies to bond the wire under surface 11-3 to the pad on package 21. Then, when the bonding is complete, arm 17 pivots upward on axle 17-1 by about 1° to break the wire. Then arm 16 pivots upward, and arms 17 and 18 pivot downward on their respective axles to place the mechanism 10 back into its initial position. Thereafter the operations of FIGS. 3A-3F are repeated.

A preferred embodiment of the invention has now been described in detail. In addition, however, many changes and modifications may be made to this embodiment without departing from the nature and the spirit of the invention.

For example, the three arms 16, 17, and 18 which position section 14-1 of wire 14 may be coupled together in another fashion so long as wire section 14-1 in one position forms an angle of at least 50° with wedge 11 and in another position forms an angle of not more than 35° with wedge 11. As another modification, the rods 15-4 which hold wire 14 between surfaces 15-1 and 15-2 of the clamp may be replaced with a hook-shaped member that forms a passageway for the wire and holds it between the surfaces 15-1 and 15-2.

Accordingly, since many such changes may be made without departing from the nature and the spirit of the invention, it is to be understood that the invention is not limited to the above described details but is defined by the appended claims.

What is claimed is:

1. An improved machine for bonding a wire between pads on an integrated circuit die and an integrated circuit package; said machine being of the type that includes an elongated wedge means for transferring heat energy to one part of said wire of sufficient magnitude to bond it to said pads, a clamping means for grasping and pulling on another part of said wire to break it after said bonding operation, and a positioning means for moving said wedge means and clamping means to selectable bonding locations over said die and said package; wherein both said wedge and said clamping means include respective passageways through which said wire is threaded and slides;

said clamping means is pivotally held by said positioning means and pivots the portion of said wire between said passageways to first and second angular positions relative to said wedge;

the portion of said wire between said passageways forms an angle of at least 50° with said wedge means in said first position and forms an angle of not more than 35° with said wedge means in said second position; and said passageway through said wedge means is tapered to permit said wire from said clamping means to pass, without bending, at both of said angular positions.

2. A machine according to claim 1 wherein said positioning means includes a first arm which pivots said wedge along its axis, a second arm which pivots said clamps essentially parallel to the steeper side of the passageway in said wedge, and a third arm which pivots said clamps essentially perpendicular to the steeper side of the passageway in said wedge.

3. A machine according to claim 2 wherein said second arm pivots on said first arm, and said third arm pivots on said second arm.

4. A machine according to claim 3 and further including respective solenoids for pivoting said arms.

5. A machine according to claim 1 wherein said clamping means includes a pair of planar surfaces that move together to grasp said wire, and a pair of spaced apart rods that extend between said surfaces to form a passageway for said wire.

6. A machine according to claim 1 wherein said clamping means includes a pair of planar surfaces that move together to grasp said wire, and a hook-shaped member between said surfaces to form a passageway for said wire.

7. A machine according to claim 1 wherein said wire forms an angle of 50°–60° with said wedge means in said first position and forms an angle of 10°–35° with said wedge means in said second position.

8. An improved machine for bonding a wire between pads on an integrated circuit die and an integrated circuit package; said machine being of the type that includes a wedge means for transferring heat energy to one part of said wire of sufficient magnitude to bond it to said pads, a clamping means for grasping and pulling on another part of said wire to break it after said bonding operation, and a positioning means for moving said wedge means and clamping means to selectable bonding locations over said die and said package; wherein both said wedge and said clamping means include respective passageways through which said wire is threaded and slides;

said clamping means moves the portion of said wire between said passageways to a first position where it makes a large angle with said wedge means, and to a second position where it makes a substantially smaller angle with said wedge means; wherein said large angle and said smaller angle differ by at least 15° and said wedge means is adapted to pass said wire without bending at both said large and small angles.

9. A machine according to claim 8 wherein said positioning means includes a first arm which pivots said wedge along its axis, a second arm which pivots said clamps at a predetermined angle with respect to said axis, and a third arm which pivots said clamps substantially perpendicular to said predetermined angle.

10. A machine according to claim 9 wherein said second arm pivots on said first arm, and said third arm pivots on said second arm.

11. A machine according to claim 8 wherein said clamping means includes a pair of planar surfaces that move to grasp said wire and a means for loosely holding said wire between said surfaces.

* * * * *